(12) United States Patent
Kayahan et al.

(10) Patent No.: US 9,197,834 B2
(45) Date of Patent: Nov. 24, 2015

(54) SELF-RESET ASYNCHRONOUS PULSE FREQUENCY MODULATED DROIC WITH EXTENDED COUNTING AND HAVING REDUCED QUANTIZATION NOISE

(75) Inventors: Hüseyin Kayahan, Istanbul (TR); Yasar Gürbüz, Istanbul (TR)

(73) Assignee: SABANCI ÜNIVERSITESI, Istanbul (TR)

(*) Notice: Subject to any disclaimer, the term of this patent is extended or adjusted under 35 U.S.C. 154(b) by 0 days.

(21) Appl. No.: 14/381,798

(22) PCT Filed: Feb. 29, 2012

(86) PCT No.: PCT/EP2012/053466
§ 371 (c)(1),
(2), (4) Date: Aug. 28, 2014

(87) PCT Pub. No.: WO2013/127450
PCT Pub. Date: Sep. 6, 2013

(65) Prior Publication Data
US 2015/0015759 A1    Jan. 15, 2015

(30) Foreign Application Priority Data

Feb. 29, 2012 (WO) ................ PCT/EP2012/053466

(51) Int. Cl.
| | |
|---|---|
| H04N 3/14 | (2006.01) |
| H04N 5/335 | (2011.01) |
| H01L 27/00 | (2006.01) |
| G01N 23/00 | (2006.01) |
| G21K 7/00 | (2006.01) |
| H04N 5/378 | (2011.01) |

(Continued)

(52) U.S. Cl.
CPC .............. *H04N 5/378* (2013.01); *H03M 1/144* (2013.01); *H04N 5/355* (2013.01); *H04N 5/37455* (2013.01); *H03M 1/60* (2013.01)

(58) Field of Classification Search
CPC .............. H04N 5/378; H04N 5/37455; H04N 5/37457; H04N 5/374; H04N 5/3698; H04N 5/355; H03M 1/60; H03M 1/144
USPC .................. 348/294–310; 250/208.1, 307
See application file for complete search history.

(56) References Cited

U.S. PATENT DOCUMENTS 8,259,196 B2 * 9/2012 Yoshikawa et al. .......... 348/241
8,878,973 B2 * 11/2014 Kawata ........................ 348/300

(Continued)

FOREIGN PATENT DOCUMENTS

WO    WO2009/138545 A1    11/2009

OTHER PUBLICATIONS

A. Nascetti and P. Valerio, "Use of Fractional Packet Counting for High Dynamic Range Imaging Applications", Nuclear Instruments and Methods in Physics Research Section A: Accelerators, Spectrometers, Detectors and Associated Equipment, vol. 648, Supplement 1, Aug. 21, 2011, pp. S146-S149.

*Primary Examiner* — Chia-Wei A Chen
(74) *Attorney, Agent, or Firm* — Epstein Drangel LLP; Robert L. Epstein

(57) ABSTRACT

The present invention proposes a CMOS sensor pixel with a pulse frequency modulated digital readout integrated circuit (DROIC) comprising a photon sensitive element for receiving a plurality of photons and providing a charge signal indicative of the received photons, an integration capacitor connected to said photon sensitive element for determining a cumulative signal based on the charge signal for a certain integration time and producing an integrator output signal based on the cumulative signal and a comparator connected to the integrator for producing a comparator output signal. Each of said pixels further comprises a DAC that switches at each clock cycle following the end of an integration time and two counters respectively counting number of resets of said integration capacitor and voltage difference between an integrator output residue signal and a reference voltage of said comparator.

8 Claims, 4 Drawing Sheets

(51) Int. Cl.
*H04N 5/355* (2011.01)
*H04N 5/3745* (2011.01)
*H03M 1/14* (2006.01)
*H03M 1/60* (2006.01)

(56) References Cited

U.S. PATENT DOCUMENTS

2002/0179838 A1* 12/2002 Porter et al. ............... 250/338.3
2006/0001750 A1* 1/2006 Mizuguchi et al. ........... 348/294
2006/0049972 A1* 3/2006 Augusto et al. ............... 341/155
2008/0043128 A1* 2/2008 Poonnen et al. ............... 348/294
2008/0165109 A1* 7/2008 Joo et al. ......................... 345/98
2008/0191139 A1* 8/2008 Coello et al. .............. 250/370.09
2009/0231479 A1* 9/2009 Zarnowski et al. ........... 348/302
2010/0259430 A1* 10/2010 Okamoto et al. ............. 341/122
2010/0328512 A1* 12/2010 Davidovici ................... 348/302
2012/0287316 A1* 11/2012 Kim et al. ..................... 348/294
2014/0292634 A1* 10/2014 Kita et al. ..................... 345/102

* cited by examiner

SELF-RESET ASYNCHRONOUS PULSE FREQUENCY MODULATED DROIC WITH EXTENDED COUNTING AND HAVING REDUCED QUANTIZATION NOISE

TECHNICAL FIELD OF THE INVENTION

The present invention relates to a digital readout with pulse frequency modulation and extended counting that achieves superior quantization noise performance. The invention benefits the wide dynamic range of conventional CMOS image sensors while reducing the quantization noise through per pixel analog to digital conversion.

BACKGROUND OF THE INVENTION

Digital readout integrated circuits (DROICs) with digital storage have immensely increased charge handling capacities compared to analog counterparts. This makes them suitable for high flux/low frame rate imaging applications. The performance of such readouts is reduced due to the quantization noise being dominant as the flux is reduced or the frame rates are increased. Various applications require high frame rate such as missile approach warning systems or airborne imaging applications. Other imaging applications that incorporate LWIR sensors require high storage capacity as the background flux is high compared to the signal to be detected. For such applications pixels with low incident photon flux levels have poor SNR reducing the quality of the image.

A digital readout with high charge handling capacity that is also capable of detecting low flux level with a high SNR is possible only by reducing the quantization noise. In order to reduce the quantization noise, smaller step sizes must be taken, which has a limit due to non-idealities of the CMOS process. The smaller the step size, which is a voltage on a storage capacitor, the higher becomes the non-idealities, which are charge injection or clock feed through errors due to switching. Moreover, capacitors cannot be made arbitrarily small, capacitors will be limited to the parasitic capacitance of the comparator node. In addition to this, in order to increase the signal to noise ratio (SNR), one has to increase the comparator reference voltage. This also contradicts to the conventional way of reducing the packet size for low quantization noise in terms of system SNR performance.

Hence reducing only the step size would not solve the quantization noise problem, without creating new ones. What is required is an effectively smaller step size, while not reducing the component sizes dramatically or if possible not at all. This can be achieved through extended counting.

Various techniques for analog to digital conversion have been proposed and applied among which are ADC per chip, ADC per column or ADC per pixel. Among all three, this invention focuses on the ADC per pixel architecture, since it reduces the requirements of the ADC, allows larger charge handling capacity as well as wide dynamic range and with the advances of silicon manufacturing technology, is becoming more attractive. The improved dynamic range means higher bit resolution with reduced step sizes, which in return results a lower quantization noise floor, hence a high SNR.

Various circuit solutions and readout methods have been proposed in the past. In the U.S. Pat. No. 8,022,350, a readout with exponentially increasing integration times have been proposed. The claimed readout increases the dynamic range, however, has limited charge storage capacity. The claimed invention uses the digital sign as end of integration and scales the output voltage with respect to the time data stored in the memory. The invention also claims the advantage of no quantization noise, which is due to not performing any ADC conversion. The implementation of the subject disclosure is different to the proposed invention as the output is analog, rather than digital.

In the U.S. Pat. No. 7,973,846 a digital readout with one bit threshold indicator and a voltage ramp is claimed. In this application, whenever the voltage threshold of the comparator is crossed, a 1 bit threshold data is sent out the pixel and the digital data corresponding to the timing of crossing is stored at the memory. An N×M×(k+1) bits of memory that is out of the pixel area is required. The technical teaching of the disclosure in question is different than that of the present invention due its limited charge handling capacity and out of pixel memory. No method to reduce quantization noise is applied.

Another approach that uses both analog and digital information out of the pixel is claimed in U.S. Pat. No. 7,795,650. The technique is applied specifically to vertically integrated sensor arrays (VISA). The disclosure presented in the '650 publication uses the asynchronous self reset with residue readout. It however has analog residue at pixel level, which is to be converted once more either on column level or chip level. The technical teaching therein differs from the present invention with its requirement of additional column based ADCs for the residue conversion and off chip (visa) memory.

A single chip solution similar to '650 patent has been claimed in the US Patent application US2010/0194956. The pixel circuit drives a digital bus fed by a comparator checking the voltage on the integration capacitor to be above the threshold level. At the end of the integration time, the residue is read to the analog bus and is converted by a column based ADC. Again the invention disclosed in the subject publication is different to the present invention by its—on-chip—column ADCs.

In the U.S. Pat. No. 6,927,796 instead of counting the residue, an estimation method is claimed with multiple non-destructive samples. The readout circuit incorporates a comparator and self reset mechanism (asynchronous self reset). At certain time instances, that is determined by the noise, various noise sources as well as a required SNR, multiple samples are quantized and the photocurrent is estimated.

The circuit implementation demonstrates a different method used to estimate the photocurrent from multiple samples, as opposed to the single sample value of the present invention.

Similar to '796 patent, in U.S. Pat. No. 7,492,400 an estimation method is used to capture multiple samples and determine the photocurrent. In this invention the method of ADC conversion is different than that of '796 patent. The ADC is shared between different pixels, to make the fine quantization followed by a coarse quantization by the comparator. Again the memory requirement is high and SNR at the high end is limited. In this disclosure, superior performance to the extended counting method is reported. This is due to the comparator offset of the extended counting method, which can be neglected when a non-uniformity correction is applied, which is usually the case especially at the IR FPAs (Focal Plane Arrays).

In another patent application, US2010/0226495, a digital readout method and apparatus is claimed. The application claims the use of both reset to voltage and charges subtract methods for synchronous readout. In an illustrative embodiment, extended counting is applied for reduced power consumption. Two charge/discharge paths to the integration capacitor that are an integer multiple to each other are used for the fine quantization phase. The approach of the invention is disadvantageous in terms of the increased non-uniformity, and in that accurate current references of sub-nano amperes are required which are hard to implement in a small pixel area. The proposed invention does not require any current or packet references, which are indeed required to be very accurate.

In another application reported in the literature with papers "A 25 μm pitch LWIR staring focal plane array with pixel-level 15-bit ADC ROIC achieving 2 mK NETD", S. Bisotto, et all, in the Proceedings of SPIE and "A 25 μm pitch LWIR focal plane array with pixel-level 15-bit ADC providing high well capacity and targeting 2 mK NETD", Fabrice Guellec, et all, also in the Proceedings of SPIE, digital readouts with asynchronous reset have been reported. However the reported work has high quantization noise due the packet sizes being very coarse.

Another publicly available example of a pulse modulated DROIC has been shown by Sofradir EC, Inc. in 2010, a well known leading company in FPA and infrared imaging modules in Europe. The circuit architecture thereof reveals the key properties such that a charge up to 3Ge- is handled and an NEDT (noise equivalent differential temperature) of 2 mK is achieved with an ADC resolution of 15 bits. However if the same readout topology is to be used for a MAW (missile approach warning) the readout should have a high frame rate requirement (typically around 800 Hz), so that the imaging will be fast and an integration as large as around 1 Ge- will not be the case but only around 75 Me-. In this scenario with the flux levels being low, or the frame rate requirements high, one should come up with a solution to reduce the quantization noise in order to operate closer to the shot noise limit.

The present invention is superior to the prior art by couple of points. Primarily, the invention offers a reduced quantization noise, while having the benefit of large charge handling capacity. This is achieved by extended counting at the pixel level ADC. The methodology of the present invention is advantageous compared to the prior art in reducing the circuit size and relaxing the circuit requirements. Extended counting is achieved through extended integration and this requires no additional circuit at the detector-readout interface. Compared to other inventions in the technical field, the present method is also advantageous in terms of its memory requirement or additional column based ADCs.

Further, the present invention improves the linearity of digital readouts. The charge that is supposed to be integrated, but rather has been reset during the reset operation, causes non-linearity. The present invention removes this non-linearity through a temporary storage switch at the pixel level.

Third the proposed invention improves the uniformity performance as well. The reset duration of two comparators will not be identical and will result in non-uniformity even if for two pixels of same photocurrent. The present invention removes this non-uniformity through a temporary storage switch at the pixel level.

OBJECTS OF THE INVENTION

Primary object of the present invention is to provide a digital readout with pulse frequency modulation having a reduced quantization noise, while having the benefit of large charge handling capacity.

Another object of the present invention is to provide a digital readout with pulse frequency modulation in which the circuit size is reduced and the circuit requirements are relaxed in the manner that a less complex and more effective circuit is provided.

Further an object of the present invention is to provide a digital readout with pulse frequency modulation in which extended counting is achieved through extended integration involving no additional circuit at the detector-readout interface.

Still further an object of the present invention is to provide a digital readout with pulse frequency modulation which is more flexible in terms of its memory requirement or additional column based ADCs Yet another object of the present invention is to provide a digital readout with pulse frequency modulation in which an improved linearity is achieved by way of removing non-linearities through a temporary storage switch at the pixel level.

Yet another object of the present invention is to provide a digital readout with pulse frequency modulation in which an improved uniformity is achieved by way of removing non-uniformities through a temporary storage switch at the pixel level.

SUMMARY OF THE INVENTION

For low photon flux levels one can increase the integration time as long as the frame rate parameter permits. Keeping in mind that the human eye realizes images above 30 Hz as video and assuming a frame rate of 50 Hz a 20 ms integration time is maximum. In case of high photon flux levels, the limit is not the frame rate; rather it is the charge handling capacity of the readout. The maximum amount of charge that can be collected on the integration capacitor before saturation takes place, can be increased by either increasing the integration capacitor or increasing the supply voltage. Analog ROICs have benefitted from this for many years and this is actually one of the reasons while still high supply levels are used in IR imaging systems. Of course this comes with the penalty of high power consumption, however for the improved SNR, this has been seen a fair trade off.

The above mentioned problems are at least to some extend solved by DROICs. Although the concept of digital readouts for infrared FPAs has a history of about 20 years, not until the recent years DROICs were on the market. There are two main approaches to DROICs. First approach can be viewed as simply an analog readout with on chip ADCs. ADCs are shared column based or sometimes block based. In this approach a nyquist rate ADC is required. This approach does not actually increase the charge handling capacity, and SNR, but decreases the noise added to the output of the buffer before the conversion to digital domain and allow on chip digital signal processing. In a second approach, integrated charge is collected as digital data.

Charge is collected on a small integration capacitor, when the integrated voltage is above a certain threshold level, a comparator is triggered and the capacitor is reset. A counter simply counts the number of comparator toggles (integrated charge packets) and a digital representation of the input current is achieved. Two major methods used in this method are Delta-Sigma Modulation and Pulse Frequency Modulation (PFM). This way a huge amount of charge can be handled simply in a register. DROICs will handle more charge and will have a better SNR than analog counter parts. The shortcoming is when the photon flux is low. In this scenario, the quantization noise sets the noise floor. In order to reduce the quantization noise the step size should be decreased. This has some potential problems. One is the increased nonlinearity due to component mismatch and wrong decisions due to comparator threshold variations. Another issue will be with a small charge packet, at the high photon flux scenario, toggle rate will be higher, leading to increased power consumption. Moreover, capacitors cannot be made arbitrarily small, capacitors will be limited to the parasitic capacitance of the comparator node. In addition to this, in order for increasing the signal to noise ratio (SNR), one has to increase the comparator reference voltage. This also contradicts to the conventional way of reducing the packet size for low quantization noise in terms of system SNR performance.

The most significant advantage of the DROICs is the immensely increased charge handling capacity, which leads unreachable SNR values by analog ROICs. The advantage of increased charge handling capacity is incomplete unless the readout is also capable of operating at lower amount of photo generated charges. A DROIC is limited to a noise floor set by the quantization noise. As the incident photon flux reduces or the frame rates increase, the amount of collected photo-generated charge is reduced and the quantization noise floor becomes more significant in the image quality.

In pulse frequency modulated systems, photocurrent is integrated on a capacitor and when the reference voltage of comparator is crossed, the comparator triggers and the counter is incremented. When the comparator is triggered the integration capacitor is reset asynchronously.

The present invention relates to a digital readout with pulse frequency modulation and extended counting and proposes two methods the first of which implements extended counting by charge addition. In the second method, extended counting is achieved through extended integration, where lower quantization noise can be achieved for a given dynamic range. The invention also proposes a method for achieving low quantization noise by using a slightly reduced frame rate.

The present invention improves the linearity and uniformity performances of the conventional digital readouts through a temporary storage switch implemented at the input stage. The invention can be applied to imaging sensor arrays, both in visible and infrared range.

BRIEF DESCRIPTION OF THE FIGURES

The figures whose brief explanations are herewith provided are solely intended for providing a better understanding of the present invention and are as such not intended to define the scope of protection or the context in which said scope is to be interpreted in the absence of the description.

DETAILED DESCRIPTION OF THE INVENTION

Figure 1:
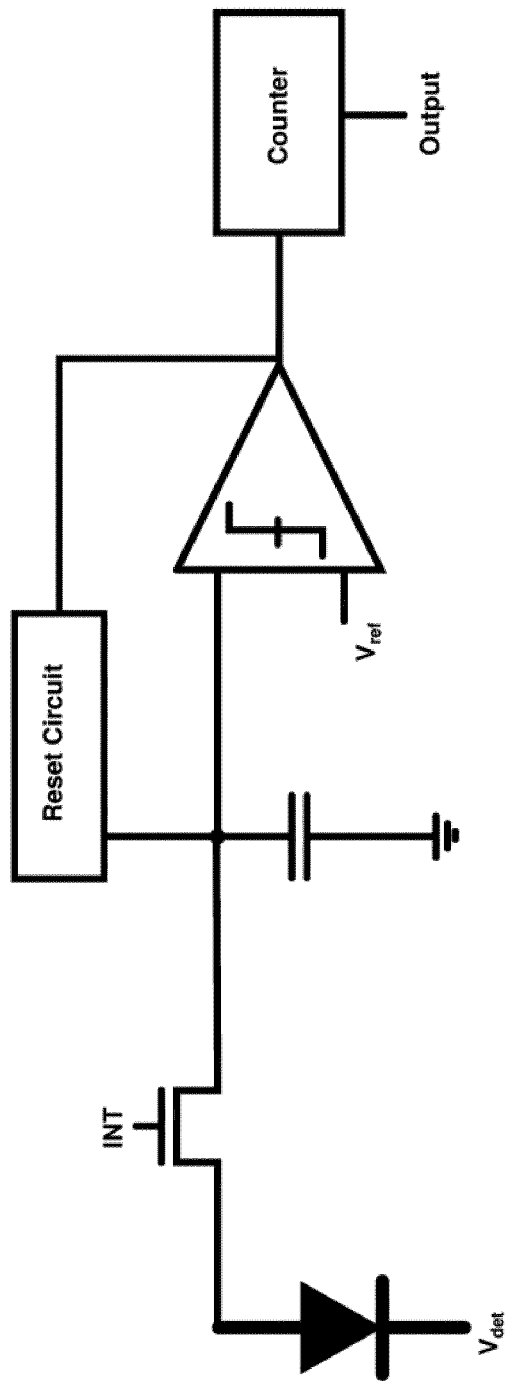
FIG. 1 demonstrates a prior art pulse frequency modulated DROIC pixel circuit.

Referring now to the figures outlined above, the present invention proposes a distinct approach to be used in the event that the flux levels are low, or the frame rate requirements are high for digital readout with pulse frequency modulation. FIG. 1 demonstrates a prior art pulse frequency modulated DROIC pixel circuit.

The core approach represented by the invention or the gist of its method as adopted is based on the following facts: The ultimate achievable SNR is limited by shot noise in imaging applications and SNR is related to the square root of the stored photo-generated charge. DROICs have larger charge handling capacity due to the storage being digital, rather than on a large integration capacitor. Although the storage capacity is high, at low flux levels or high frame rates (when the capacity is not filled) DROICs suffer from poor SNR which is dominated by the quantization noise.

To that end, an extended counting method with smaller step size, following a coarse quantization is used to lower the quantization noise. The extended counting method which constitutes the principal approach of the present invention as defined in claim 1 is delineated below.

Figure 2:
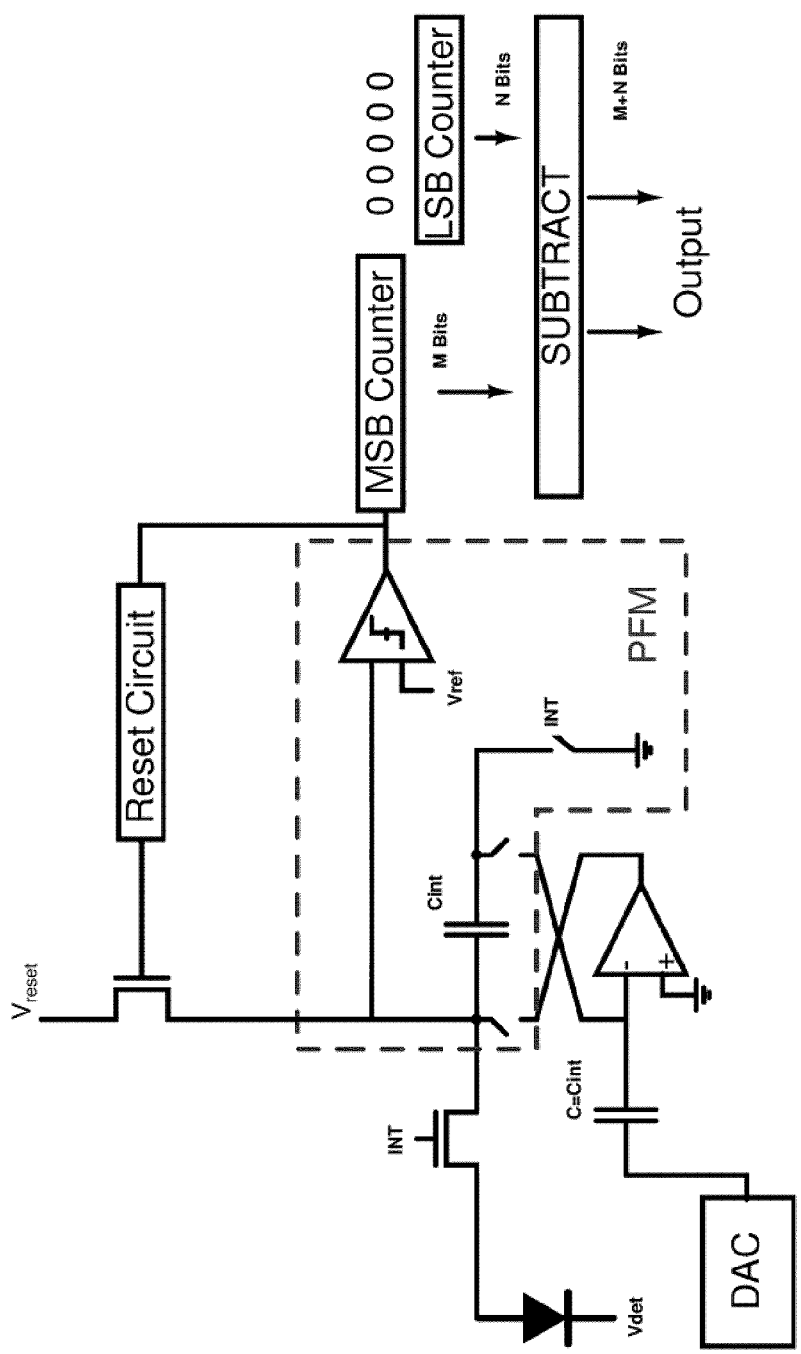
FIG. 2 demonstrates the block diagram of the proposed circuit according to a first embodiment of the present invention.

According to the present invention, a DAC that switches at each clock cycle following the end of integration time is used for the extended counting method. A single DAC can be used per chip, or multiple DACs for groups of pixels can be used. At each pixel, the value of the DAC is added to the integration capacitor until the comparator triggers. One solution for the addition will be implemented by the use of a capacitive transimpedance amplifier (CTIA). Following the integration at every clock cycle, DAC will increment one step and an amount of charge to increase the integration capacitor to the same value will be transferred by the CTIA. There will be two counters under the pixel, one for the most significant bits, and one for the least significant bits. The least significant bit counter will count the voltage difference between the residue and the comparator reference voltage by counting the number of DAC state changes. When the comparator triggers, the most significant bit counter will increment one more and the least significant counter will stop. Finally the output data will be the difference of the two counters. In this scheme, DAC resolution will set the quantization error floor. The block diagram of the proposed circuit according to a first embodiment of the present invention is shown in FIG. 2.

Figure 3:
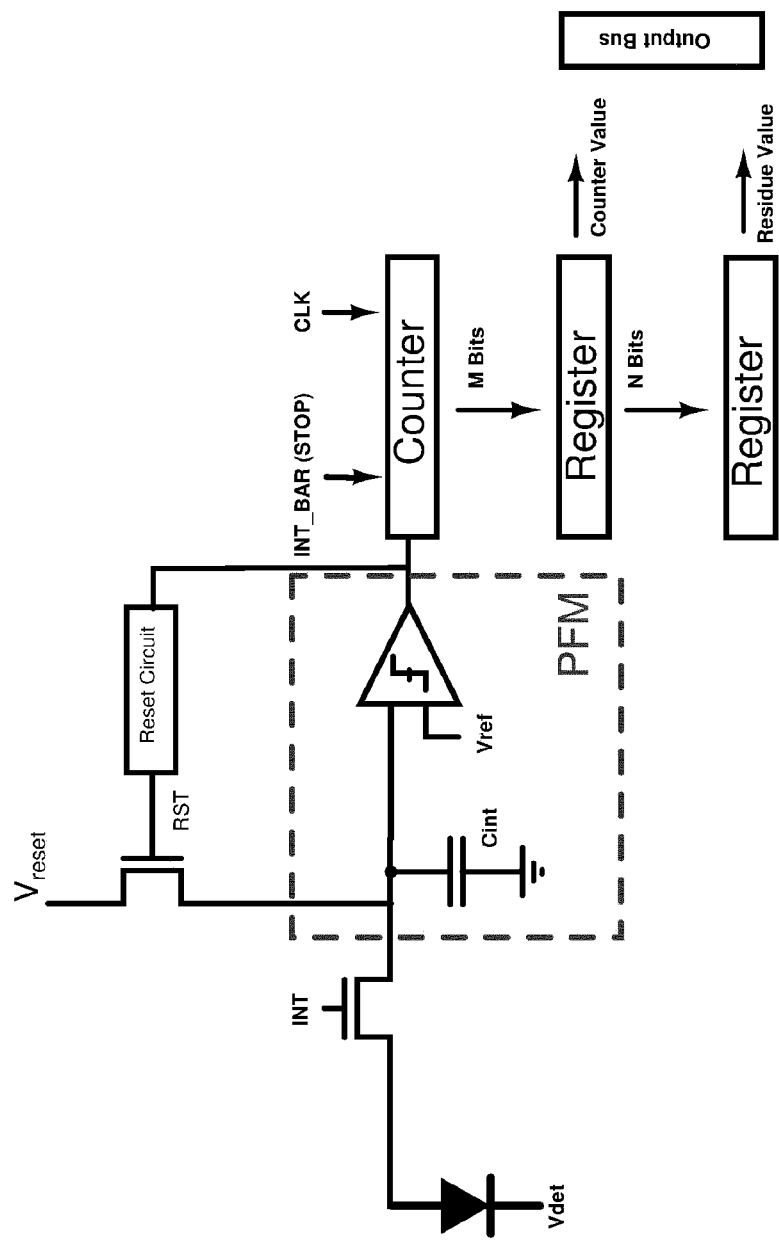
FIG. 3 demonstrates the block diagram of the proposed circuit according to a second embodiment of the present invention.

A second approach is shown in FIG. 3. In this case the added circuit complexity is simple but the penalty is a dead time following the integration time and two times the bit rate out of the pixel. The architecture is again a pulse frequency modulated DROIC. Following the end of integration time the counter value is read to a register and the counter is reset. Although the integration time has ended, the pixel continues to integrate until the comparator triggers one more time. The counter also continues to increment its value as a clocked counter: that is, it increments its value every clock cycle with a residue integration clock until the comparator triggers again. When the comparator triggers, the counter stops and at this instant, the value of the counter and the register are ready to be read out. From these two data an exact value of the integrated charge during the integration time can be obtained. In this way every pixel can have different integration times, pixel outputs are further processed to obtain the corresponding output with respect to the global integration time. The quantization error in this case will be signal dependent with a step size of the integrated charge in a single clock cycle. The quantization noise again will be lowered, as well as the quantization noise being smaller for lower signal levels than higher ones.

In a nutshell, both methods of the present invention proposes the following common steps for optimizing quantization noise of a pulse frequency modulated digital readout integrated circuit (DROIC). Those are: a) receiving a plurality of photons on said photon sensitive element, the latter providing a charge signal indicative of the received photons and b) determining a cumulative signal based on the charge signal for a certain integration time and producing an output signal based on the cumulative signal by means of said integration capacitor being connected to said photon sensitive element, c) comparing the cumulative signal value of said integration capacitor with a reference signal by means of said comparator d) resetting said integration capacitor upon triggering of said comparator and e) counting number of resets of said integration capacitor by means of a first counter. However, said methods differ from each other in that the first method comprises the additional steps of: f) incrementing said DAC one step at each clock cycle following the termination of said integration time, g) adding the signal value of said DAC to the residue signal of said integrator capacitor, h) counting number of DAC transitions to evaluate the added charge to fill the integration capacitor by means of a second counter i) incrementing said first counter one more time if the comparator threshold level is crossed and j) calculating the difference of said first and said second counters as the output of said pixel. The final step of the method can be carried out such that both data of said first and second counters is transferred to a periphery circuit where the subtraction takes place before the data is output.

Further, said second method comprises the additional steps of: f) registering the value of the counter to a first register following the end of said integration time, g) resetting said counter and continuing integration by said integration capacitor until said comparator triggers one more time, h) operating said counter as clocked counter that increments its value one at every clock cycle by means of a global residue counting clock and registering the value of the counter to a second register i) incrementing said first register value by one and, j) calculating the digital representation of the integrated charge by multiplying the fraction of the integration time over the extended integration time by said register value.

It is worthy of note that the integration time can be set as analog in which case, it is measured by the residue clock and a chip level counter. It can also be set as digital data, in this case no counters are required.

A comparison of the two methods is as follows: In terms of circuit complexity second approach is simpler, and requires smaller in-pixel area. Hence for MWIR applications with smaller pitch sizes such as 15 μm×15 μm, the second approach can be more feasible. In terms of dynamic range, the first approach is superior due there is no practical limit at the low flux case for the first method. The dynamic range is limited by the dead time allocated in the second method since for the residue to trigger the comparator one more time, the dead time allocated after the integration time may be insufficient. The clock rate in the second approach is about two times the first method in order to get two times data out of a pixel. In the second approach, maximum integration time is slightly reduced for the same frame rate due to the dead time.

In conventional PFM circuits the reset time of the comparator can cause significant non-linearity especially, if the comparator is based on an op-amp. This is due to the fact that for fast resetting, bandwidth should be increased. The increase in bandwidth increases the power consumption with its square. Since power is one of the most critical system parameters other measures to improve linearity should be found. Assuming a finite reset time of treset, count value with respect to the input current can be calculated as:

$$\left(\frac{V_{ref} \times C_{int}}{i} + t_{reset}\right) \times \text{Count} = T_{INT}$$

$$(Q_{packet} + i \times t_{reset}) \times \text{Count} = i \times T_{INT}$$

$$\text{Count} = \frac{i \times T_{INT}}{Q_{packet} + i \times t_{reset}}$$

Where Vref is the comparator reference voltage, Cint is the integration capacitance and TINT is the integration time.

Clearly, for a linear relationship between the current and the Count value, $i \times t_{reset}$ must be zero. This limits the use of op-amp comparator, due its response being slow for low power operation.

Figure 4:
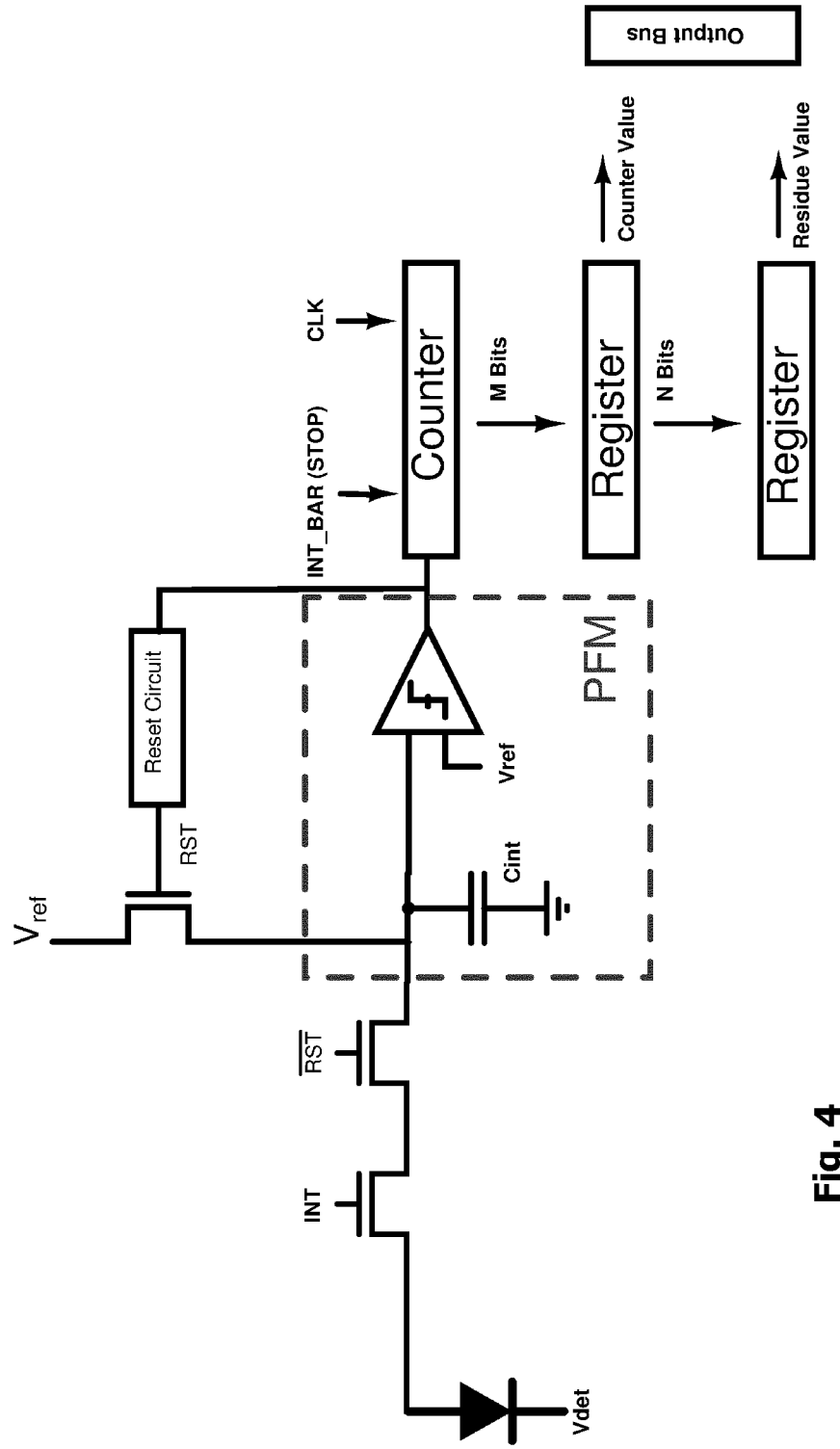
FIG. 4 demonstrates the block diagram of a modified pixel circuit to improve linearity according to the present invention.

A circuit solution to overcome the non-linearity due to finite comparator transition time is shown in FIG. 4. In this approach $i \times t_{reset}$ product is saved at the temporary node. Whenever the integration capacitor is to be reset, a secondary (PMOS or NMOS) switch is opened first, preventing the loss of charge during the finite reset time by preserving the charge at its source node capacitance. The reset operation takes place next. During the reset due the secondary switch is open, no connection to the reset node is available, hence no signal charge is lost. Signal charge is stored temporarily at the source node of the secondary transistor. This results in better linearity.

As described above, the proposed two switch architecture improves the linearity by eliminating the charge loss during finite reset time. This also helps to improve uniformity. Even if two pixels have the same current, they will have finite reset durations which are not identical, hence the response will not be uniform. However if the two switch reset is applied, then there is no charge loss during the reset time, and the response will be uniform. Hence the proposed reset circuit also improves the uniformity of the digital readout integrated circuits.

The invention claimed is:

1. A pixel with a pulse frequency modulated digital readout integrated circuit (DROIC) comprising a photon sensitive element for receiving a plurality of photons and providing a charge signal indicative of the received photons, an integration capacitor connected to said photon sensitive element for determining a cumulative signal based on the charge signal for a certain integration time and producing an integrator output signal based on the cumulative signal and a comparator connected to said integrator for producing a comparator output signal characterized in that each of said pixels further receives output value of a DAC that switches at each clock cycle following the end of an integration time and a first and a second counters respectively counting number of resets of said integration capacitor and measuring voltage difference between an integrator output residue signal and a reference voltage of said comparator, said voltage difference being measured such that the signal value of said DAC is added to the residue signal of the integration capacitor at every clock cycle following said integration time and that said DAC increments one step while an amount of charge is transferrable to the integration capacitor and number of DAC transitions is counted at pixel level by said second counter to evaluate the added charge to fill said integration capacitor.

2. An image sensor having a plurality of pixels with pulse frequency modulated digital readout integrated circuits (DROICs) according to claim 1.

3. An image sensor having a plurality of pixels with pulse frequency modulated digital readout integrated circuits (DROICs) according to claim 2 wherein a periphery circuit is provided to process pixel outputs to obtain a corresponding output with respect to a global integration time.

4. A method for optimizing quantization noise of a pulse frequency modulated digital readout integrated circuit (DROIC) of a pixel comprising a photon sensitive element, an integration capacitor, a comparator, a DAC and a plurality of counters, said method for optimizing quantization noise comprising the steps of:
   a) receiving a plurality of photons on said photon sensitive element, the latter providing a charge signal indicative of the received photons, b) determining a cumulative signal based on the charge signal for a certain integration time and producing an output signal based on the cumulative signal by means of said integration capacitor being connected to said photon sensitive element, c) comparing the cumulative signal value of said integration capacitor with a reference signal by means of said comparator, d) resetting said integration capacitor upon triggering of said comparator, e) counting number of resets of said integration capacitor by means of a first counter, f) incrementing said DAC one step at each clock cycle following the termination of said integration time, g) adding the signal value of said DAC to the residue signal of said integrator capacitor, h) counting number of DAC transitions to evaluate the added charge to fill the integration capacitor by means of a second counter, i) incrementing said first counter one more time if the comparator threshold level is crossed and, j) calculating the difference of said first and said second counters as the output of said pixel.

5. A method for optimizing quantization noise of a pulse frequency modulated digital readout integrated circuit (DROIC) of a pixel as set forth in claim 4 wherein the step of adding the signal value of said DAC to the cumulative signal of said integration capacitor is implemented by a capacitive transimpedence amplifier (CTIA).

6. A method for optimizing quantization noise of a pulse frequency modulated digital readout integrated circuit (DROIC) of a pixel as set forth in claim 4 wherein the integration capacitor is reset by way of opening a secondary switch to prevent loss of charge during the finite reset time by temporarily preserving the charge at its source node capacitance before the reset operation takes place such that no connection to the reset node is available.

7. A method for optimizing quantization noise of a pulse frequency modulated digital readout integrated circuit (DROICs) of a pixel comprising a photon sensitive element, an integration capacitor, a comparator, a counter and a plurality of registers, said method for optimizing quantization noise comprising the steps of:

a) receiving a plurality of photons on said photon sensitive element, the latter providing a charge signal indicative of the received photons, b) determining a cumulative signal based on the charge signal for a certain integration time and producing an output signal based on the cumulative signal by means of said integration capacitor being connected to said photon sensitive element, c) comparing the cumulative signal value of said integration capacitor with a reference signal by means of said comparator, d) resetting said integration capacitor upon triggering of said comparator, e) counting number of resets of said integration capacitor by means of a counter, f) registering the value of the counter to a first register following the end of said integration time, g) resetting said counter and continuing integration by said integration capacitor until said comparator triggers one more time, h) operating said counter as clocked counter that increments its value one at every clock cycle by means of a global residue counting clock and registering the value of the counter to a second register, i) incrementing said first register value by one and, j) calculating the digital representation of the integrated charge by multiplying the fraction of the integration time over the extended integration time by said register value.

8. A method for optimizing quantization noise of a pulse frequency modulated digital readout integrated circuit (DROIC) of a pixel as set forth in claim 7 wherein the integration capacitor is reset by way of opening a secondary switch to prevent loss of charge during the finite reset time by temporarily preserving the charge at its source node capacitance before the reset operation takes place such that no connection to the reset node is available.

* * * * *